US006717456B2

(12) United States Patent
Watanabe

(10) Patent No.: US 6,717,456 B2
(45) Date of Patent: Apr. 6, 2004

(54) LEVEL CONVERSION CIRCUIT

(75) Inventor: Hiroshi Watanabe, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/321,319

(22) Filed: Dec. 17, 2002

(65) Prior Publication Data

US 2003/0132794 A1 Jul. 17, 2003

(30) Foreign Application Priority Data

Dec. 21, 2001 (JP) ........................................ 2001-388907

(51) Int. Cl.[7] .......................................... H03K 19/0175
(52) U.S. Cl. ............................ 327/437; 326/31; 326/81
(58) Field of Search ................................. 327/391, 333, 327/437, 427; 326/60, 80, 81, 68, 31, 86

(56) References Cited

U.S. PATENT DOCUMENTS 6,320,408 B1 * 11/2001 Kwong ........................ 327/437
6,498,509 B2 * 12/2002 Fournel ........................ 327/80

FOREIGN PATENT DOCUMENTS

FR 002555380 * 5/1985

* cited by examiner

Primary Examiner—Dinh T. Le
(74) Attorney, Agent, or Firm—William B. Kempler; W. James Brady, III; Frederick J. Telecky, Jr.

(57) ABSTRACT

A high-frequency compatible bidirectional level conversion circuit in which high-voltage port A and low-voltage port B are connected using pass transistor 12, and the side of port A is connected to power supply voltage terminal C using primary and secondary switching circuits 21 and 22 connected in parallel. When port B changes from low level to high level to transmit a level-converted signal from the side of port B to the side of port A, the level at port A rises to turn on primary and secondary switching circuits 21 and 22, and secondary switching circuit 21 turns off after port A has reached the high level. When secondary switching circuit 22 is configured to have a lower impedance than that of primary switching circuit 21, the load capacitance connected to port A is charged by a high current which flows in secondary switching circuit 22 as the level of port A rises. When port B changes from the high level to the low level, secondary switching circuit 22 remains off.

6 Claims, 3 Drawing Sheets ically to the applied power supply voltage, is desirable.

LEVEL CONVERSION CIRCUIT

FIELD OF THE INVENTION

The present invention pertains to the field of level conversion circuit technology; in particular, it pertains to a bidirectional level conversion circuit.

BACKGROUND OF THE INVENTION

The integration density of ICs for electronic equipment systems is increasing, with corresponding reductions in the power supply voltages used. For example, with the advent of LSI, a system which formerly operated with a 5V power supply came to require only a low-voltage power supply, such as 3.3V or 2.5V. Furthermore, in recent years, it has become more common with ICs to use several power supply voltages. With such a system, it is necessary to apply a level conversion to a 5V signal to obtain a low-voltage signal of 3.3V, or to apply level conversion to a low-voltage signal of 3.3V to obtain 5V, for example.

This type of conversion can be achieved using a variety of methods, and special logic ICs for level conversion are also available.

Reference numeral 101 in FIG. 3 indicates an example level conversion circuit which uses a pass transistor 102 from an N-channel MOS transistor out of the internal circuit of a logic IC of the prior art.

In said level conversion circuit 101, the gate terminal of pass transistor 102 is connected to power supply voltage line C via diode 103, and pass transistor 102 is turned on by power supply voltage $V_{CC}$ from power supply voltage line C. When the voltage at the gate terminal with respect to the source terminal is denoted as gate voltage $V_{tn}$, voltage $V_B$ at port B serving as the source terminal will be lower than voltage $V_{s0}$ of the gate terminal by gate voltage (threshold voltage) $V_{tn}$ regardless of the level of voltage $V_A$ at port A serving as a drain terminal.

That is, voltage $V_B$ at port B is restricted to (voltage $V_{s0}$ of gate terminal−gate voltage $V_{tn}$) as long as voltage $V_A$ of port A is higher than voltage $V_B$ of port B.

For example, as long as the voltage of port terminal A is 3.3V or higher, a voltage $V_B$=3.3V can be generated by level-converting voltage $V_A$ at port A if $V_{tn}$=1.0V, and voltage $V_{s0}$ at gate terminal is 4.3V to give an output of 3.3V voltage at port B. Therefore, even if voltages of 5V and 3.3V must both be handled in terms of interfacing with the bus, both voltages can be handled by keeping pass transistor 102 conductive.

Also, because the propagation of a signal from port A to port B can be shut off by bringing voltage $V_{s0}$ of the gate terminal to the GND level and disconnecting pass transistor 102, hot-line attachment/detachment function of the bus can be realized effectively. The delay time of a signal from port A to port B can be made small enough to be ignored by reducing the on-resistance of pass transistor 102.

While the level conversion circuit 101 is capable of high level to low level conversion, it is incapable of low level to high level conversion. When it is used for interfacing with a bus, there are many cases which require bidirectional level conversion.

Reference numeral 111 in FIG. 4 shows an example of such a level conversion circuit, where the configuration is identical to that of level conversion circuit 101 in FIG. 3, except that port A is pulled up to the level of high voltage power supply terminal D with pull-up resistor 115.

Here, too, in the case of said level conversion circuit 111, assuming that the voltage on the gate terminal of pass transistor 102 is $V_{S0}$, pass transistor 102 turns off if voltage $V_B$ at port B is greater than or equal to $V_{S0}-V_{tn}$. As a result, high power supply voltage $V_{CCH}$ is applied at port A via pull-up resistor 115. If high power supply voltage $V_{CCH}$ is 5.0V, and voltage $V_B$ at port B is 3.3V, voltage $V_A$ at port A is 5.0V, which means that the low voltage signal of 3.3V has been level-converted to a high voltage signal of 5.0V.

Although capable of bidirectional level conversion between ports A and B, said level conversion circuit 111 has the following shortcomings.

(1) When voltage $V_A$ at port A changes from low level to high level as voltage $V_B$ at port B is propagated to port A, said change in voltage is regulated in accordance with a time constant determined on the basis of the resistance of pull-up resistor 115 and the load capacitance of port A at the point where the level of voltage $V_A$ has become greater than $V_{S0}-V_{tn}$, so that the change is subject to a delay. Therefore, the circuit cannot follow high-frequency signals.

(2) When voltage $V_A$ at port A is at the low level, there is a continuous large current flow into pull-up resistor 115.

(3) Because pull-up resistor 115 is outside to level conversion circuit 111, that is, an extra part is needed, extra real estate is required.

A general object of the present invention is to present a power-saving and space-saving level conversion circuit capable of bidirectional level conversion even for high-frequency signals.

SUMMARY OF THE INVENTION

In order to solve the problems, the level conversion circuit of one aspect of the present invention is provided with a first port to which a first logic level signal is applied, a second port to which a second logic level signal is applied, which has a logic level lower than the first logic level, a transistor connected between the first and the second ports, a first switching circuit which is connected between a power supply terminal to which a power supply voltage corresponding to the first logic level is applied and the first port and becomes conductive according to the first port level, and a second switching circuit which is connected between the power supply terminal to which the power supply voltage corresponding to the first logic level is applied and the first port and becomes conductive together with the first switching circuit only for a prescribed period, wherein a signal having different levels can be propagated from the first port to the second port or from the second port to the first port.

In one aspect of the present invention, it is desirable that the resistance be greater when the first switching circuit is conductive than when the second switching circuit is conductive. Preferably, it is provided with a pulse generator which generates a pulse signal used for temporarily turning on the second switching circuit in accordance with changes in the logic level of the first port.

In addition, in one aspect of the present invention, it is desirable that the pass transistor and the first and the second switching circuits be configured with MOS transistors. Preferably, in accordance with an aspect of the present invention, the transistor is an NMOS transistor, and a voltage higher than a power supply voltage corresponding to the second logic level by an amount equivalent to the threshold voltage of said NMOS transistor is applied to the gate terminal of the NMOS transistor.

Furthermore, it is desirable, according to another aspect of the invention, that it be provided with a NAND gate having 2 input terminals respectively connected to the first port and an enable signal application terminal and a power supply circuit configured with a diode and a resistor connected in series between the power supply terminal to which the power supply voltage corresponding to the first logic level is supplied and a power supply terminal to which a reference voltage is supplied, where the first and the second switching circuits are respectively configured with first and second PMOS transistors, the first pulse generator is configured with a resistor and a capacitor connected in series between the power supply terminal to which the power supply voltage corresponding to the first logic level is supplied and the output terminal of the NAND gate, and the gate terminal of the first PMOS transistor is connected to the output terminal of the NAND gate, the gate terminal of the second PMOS transistor is connected to the midpoint of the connection node between the resistor and the capacitor of the pulse generator, the gate terminal of the NMOS transistor is connected to the midpoint of the connection node between the diode and the resistor of the voltage supplying circuit.

According to a further aspect of the present invention, when a low-level signal is referenced to ground potential, the power supply voltages corresponding to the first and second logic levels are at positive or negative voltages, and the first and the second ports serve as a transmission path for a binary signal comprising high and low levels with different logic levels.

A transistor is provided according to an aspect of the invention between the first and the second ports, where the terminals are disconnected from each other when the transistor is turned off and connected when it is turned on., When, in accordance with an aspect of the invention, the transistor is a MOS transistor and is configured so that the source terminal is connected to the second port on the low voltage side, the drain is connected to the first port on the high voltage side, and a voltage greater than or equal to the threshold voltage is applied to the gate terminal with respect to the source terminal, the drain terminal voltage changes according to the source terminal voltage, so that when a signal having the second logic level is applied to the source terminal, a signal having a higher logic level, that is, the first logic level can be obtained at the drain terminal.

When, in accordance with an aspect of the invention, the potential of the second port is to be changed from the reference potential to the power supply voltage corresponding to the second logic level, the potential of the power supply voltage supplied to the first and the second switching circuits is changed to that of the power supply voltage corresponding to the first logic level. In this case, if the second switching circuit conducts when the potential of the first port begins to change, a large current is supplied to the first port from the power supply. Thus, the load capacitor connected to the first port gets charged quickly, and a waveform of a quickly changing voltage can be obtained.

On the other hand, when, in accordance with an aspect of the invention, changing the potential of the first port from that of the power supply voltage corresponding to the first logic level to the reference potential by changing the potential of the second port from the power supply voltage corresponding to the second logic level to the reference potential, the second switching circuit is kept on in order to reduce the burden on the circuit for changing the potential of the second port.

REFERENCE NUMERALS AND SYMBOLS AS SHOWN IN THE DRAWINGS

In the figures, A represents a first port, B a second port, 2, 3 a level conversion circuit, 12 a pass transistor, 21 a primary switching circuit, and 22 a secondary switching circuit.

DESCRIPTION OF THE EMBODIMENTS

Figure 1:
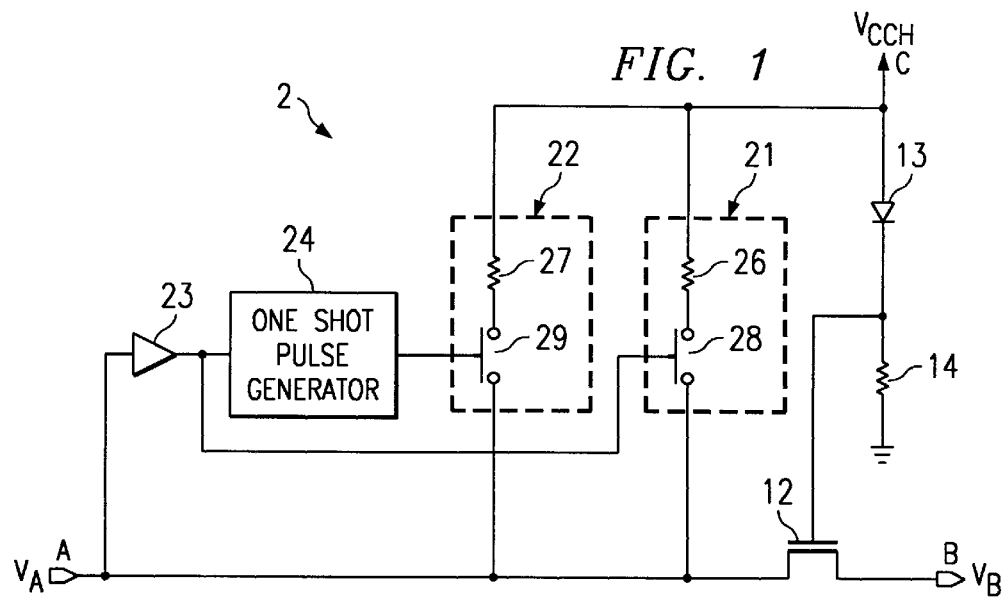
FIG. 1 is a circuit diagram of an example of a level conversion circuit of the present invention.

Reference numeral 2 in FIG. 1 shows an example of a level conversion circuit of the present invention.

Said level conversion circuit 2 has pass transistor 12, which is an N-channel MOS transistor, diode 13, resistor 14, buffer 23, pulse generator 24, primary switching circuit 21, and secondary switching circuit 22.

Anode terminal of diode 13 is connected to power supply voltage terminal C, and the cathode terminal is connected to one end of resistor 14. The other end of said resistor 14 is connected to ground potential. Thus, diode 13 and resistor 14 are connected in series between power supply voltage terminal C and ground potential.

Gate terminal of pass transistor 12 is connected between diode 13 and resistor 14 at the cathode terminal of diode 13. Power supply voltage $V_{CCH}$ is applied to power supply voltage terminal C. If the forward voltage drop of diode 13 is $V_D$, then $V_{CCH}-V_D$ is applied to the gate terminal of pass transistor 12.

Drain terminal and source terminal of pass transistor 12 are respectively connected to port A as the first port and port B as the second port.

Primary and secondary switching circuits 21 and 22 are respectively connected to power supply voltage terminal C at one end, and to port A at the other end.

Input terminal of buffer 23 is also connected to port A. Output terminal of buffer 23 is directly connected to primary switching circuit 21 and is connected to secondary switching circuit 22 via pulse generator 24.

Buffer 23 changes the impedance and outputs the input signal without changing its voltage level. Therefore, a voltage at the same level as voltage $V_A$ at port A is input to pulse generator 24 and primary switching circuit 21.

Primary and secondary switching circuits 21 and 22 have primary switching element 28 and secondary switching element 29, respectively. Primary switching element 28 and secondary switching element 29 are configured such that they turn off when the input voltage is at the low level, and turn on when the input voltage is at a prescribed voltage above the low level.

For example, when port A serves as the input, port B serves as the output, and if voltage $V_A$ at port A is at the low level, then primary switching element 28 and secondary switching element 29 are both off. Because the voltage applied to the gate terminal of pass transistor 12 is above threshold voltage of pass transistor 12, pass transistor 12 will be on, connecting port B to port A to ground potential via pass transistor 12. That is, when voltage $V_A$ at port A is low, voltage $V_B$ at port B is also low.

On the other hand, pass transistor 12 also turns on when port B serves as the input, with port A serving as the output, and $V_B$ is low. As a result, voltage $V_A$ at port A is also low. Here, too, primary switching element 28 and secondary switching element 29 are both off.

Next, the case in which voltage $V_B$ at port B changes from low to high while port B serves as the input and port A serves as the output will be considered.

Here, assume that the high-level voltage (first voltage) at port A and the high-level voltage (second voltage) at port B are both positive voltages, and that the high-level voltage at port A is greater than the high-level voltage at port B.

In addition, in the present embodiment, the high-level voltage on the side of port A is at the same level as power supply voltage $V_{CCH}$ applied to power supply voltage terminal C; for example, power supply voltage $V_{CCH}$ and the high-level voltage on the side of port A are 5V.

On the other hand, the high-level voltage on the side of port B is lower than the high-level voltage on the side of port A, for example, 3.3V.

In short, if the voltage levels at ports A and B when at the high level are denoted as "high level A" and "high level B," respectively, then (Voltage at high level A)>(Voltage at high level B).

If the threshold voltage of pass transistor 12 is denoted as $V_{tn}$, a voltage given by $V_{SO}$=high level B+$V_{tn}$ is applied for voltage $V_{SO}$ at the gate terminal of pass transistor 12.

When voltage $V_B$ rises from low to high level B, the voltage at the drain terminal of pass transistor 12, that is, voltage $V_A$ at port A, rises along with the voltage of the source terminal, that is, voltage $V_B$ at port B.

Rising voltage $V_A$ at port A is input directly into primary switching circuit 21 via buffer 23, and primary switching circuit 28 is turned on when voltage $V_A$ at port A exceeds the low level and reaches a prescribed voltage less than or equal to the voltage at high level B.

Voltage $V_A$ at port A is also input to pulse generator 24 via buffer 23.

Said pulse generator 24 is a one-shot pulse generator which outputs a voltage pulse used to turn on secondary switching element 29 as the input voltage rises to turn on primary switching circuit 28.

Therefore, when voltage $V_A$ of port A rises, primary switching circuit 28 and secondary switching circuit 29 turn on simultaneously.

Primary and secondary resistors 26 and 27 are respectively connected in series with primary and secondary switching circuits 28 and 29, so that power supply voltage terminal C and port A can be connected to each other via the primary and secondary switching circuits 28 and 29.

Therefore, because port A is connected to power supply voltage terminal C by primary and secondary switching circuits 28 and 29 when primary and secondary switching circuits 28 and 29 are both closed, primary current 11 which flows from power supply voltage terminal C through primary resistor 26 and secondary current 12 which flows through secondary resistor 27 are both supplied to port A.

As a result, the load capacitance connected to port A is charged by primary current $I_1$ and secondary current 12, so that voltage $V_A$ at port A rises quickly, exceeding the level of voltage $V_B$ at port B and quickly reaching the voltage of high level A.

A time constant circuit is provided in pulse generator 24, where pulse generator 24 turns secondary switching circuit 29 off after a fixed period of time has passed after it outputs the voltage to close secondary switching element 29.

At this time, because voltage $V_A$ at port A has already reached high level A, and a voltage at the same level as that of voltage $V_A$ at port A is constantly output from buffer 23, primary switching 28 remains on.

In this condition, port A is connected to power supply voltage terminal C by primary switching circuit 21, and high level A at port A is maintained by power supply voltage $V_{CCH}$ applied from power supply voltage terminal C. When voltage $V_A$ at port A is at high level A, the potential difference across primary resistor 26 is zero, so that no current flows through primary resistor 26.

Next, the case in which port B changes from high level to low level at B will be explained.

When there is a stable voltage at high level B at port B and high level A at port A, primary switching circuit 21 is on but secondary switching circuit 22 is off.

Although voltage $V_A$ at port A also begins to fall as voltage $V_B$ at port B begins to fall, primary switching circuit 21 remains on until voltage $V_A$ at port A reaches a prescribed voltage value less than or equal to high level B.

As a result, when voltage $V_A$ at port A begins to fall, a potential difference appears across primary resistor 26, and primary current 11 begins to flow through primary resistor 26. In addition, because the load capacitance begins to discharge as voltage $V_A$ at port A falls, said discharge current and primary current 11 which flows into primary resistor 26 flow through pass transistor 12 into the circuit which drives port B.

Because the resistance of primary resistor 26 is greater than the resistance of secondary resistor 27, primary current 11 which flows through primary resistor 26 is small enough to be ignored in comparison with secondary current 12. Therefore, port B driving circuit only needs to handle the discharge current of the load capacitance, and voltage $V_A$ at port A falls quickly even when the current driving capability is low.

Because primary current 11 stops flowing when primary switching element 28 is turned off as voltage $V_A$ at port A falls, port A reaches the low level more quickly.

Next, the case in which voltage $V_A$ at port A changes from low level to high level A while port A serves as the input side and port B serves as the output side will be explained.

When port A goes from low level to high level A, primary and secondary switching elements 28 and 29 become conductive simultaneously as voltage $V_A$ at port A has risen to the level greater than or equal to the prescribed voltage, and port A is connected to power supply voltage terminal C via both primary and secondary switching circuits 28 and 29. Therefore, primary and secondary currents $I_1$ and $I_2$ which flow through primary and secondary resistors 26 and 27 are both supplied to port A to accelerate the voltage rise.

After a prescribed amount of time has passed, secondary switching element 29 is turned on by pulse generator 24, by which time port A has already reached high level A.

When voltage $V_A$ at port A goes from high level A to low level, voltage $V_B$ at port B follows voltage $V_A$ at port A.

Figure 2:
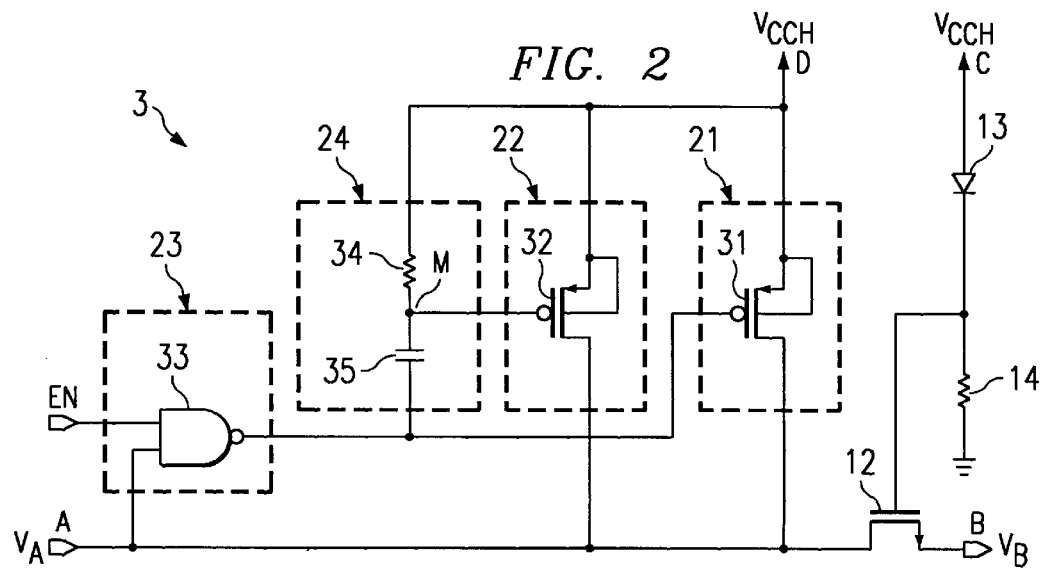
FIG. 2 is an example of a level conversion circuit in which said circuit diagram is more detailed.
Figure 3:
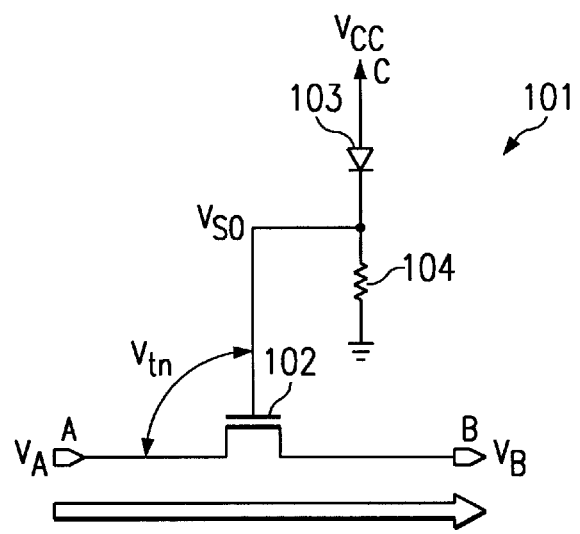
FIG. 3 shows a unidirectional level conversion circuit of the prior art.
Figure 4:
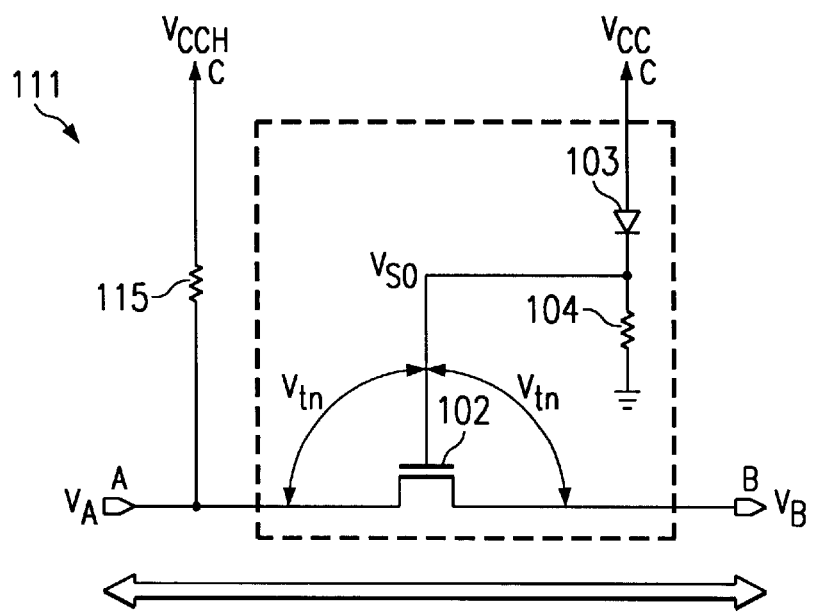
FIG. 4 shows a bidirectional level conversion circuit of the prior art.

Reference numeral 3 in FIG. 2 shows a specific level conversion circuit 2 in which the level conversion circuit in FIG. 1 is implemented, where primary and secondary switching circuits 21 and 22 are configured with P-channel MOS transistors, the switching function of primary and secondary switching elements 28 and 29 is realized by means of turning the transistors on and off, and the current control function of primary and secondary resistors 26 and 27 is realized by means of the internal resistance of the MOS transistors.

In addition, if buffer 23 is configured with NAND-gate 33, an input terminal at one end is connected to port A, the other end is connected to an EN terminal, and a voltage of high level B is applied to the EN terminal, then the voltage at port A is will be inverted.

In this case, as voltage $V_A$ at port A rises from the low level to high level A, or when it falls from high level A to the low level, output voltage of NAND-gate 33 gets inverted between high level A and the low level at the point where it has exceeded the threshold voltage of NAND-gate 33.

Because primary and secondary switching elements 28 and 29 are P-channel MOS transistors, they conduct when a low-level voltage is output from NAND-gate 33.

Pulse generator 24 is configured as a series circuit comprising time constant resistor 34 and capacitor 35. The terminal of said series circuit on the side of time constant resistor 34 is connected to power supply voltage terminal D, to which power supply voltage $V_{CCH}$ is applied. The terminal on the side of capacitor 35 is connected to the output terminal of NAND-gate 33.

Output terminal of NAND-gate 33 is directly connected to the gate terminal of P-channel MOS transistor 31 of primary switching circuit 21 as well as to one end of capacitor 35 of the series circuit comprising capacitor 35 and time constant resistor 34.

Assuming that the node connecting capacitor 35 and time constant resistor 34 is denoted M, when the voltage at the output terminal of NAND-gate 33 goes from high level A to low level, the voltage at the gate terminal of P-channel MOS transistor 31 of primary switching circuit 21 and the voltage at node M go to the low level instantaneously.

Therefore, P-channel MOS transistors 31 and 32 of primary and secondary switching circuits 21 and 22 turn on simultaneously. Subsequently, as capacitor 35 is charged by the current which went through time constant resistor 34, the voltage at node M rises, and P-channel MOS transistor 32 of secondary switching circuit 22 is no longer able to remain on, P-channel MOS transistor 32 of secondary switching circuit 22 turns off while P-channel MOS transistor 31 of primary switching circuit 21 remains on.

A transistor with a small area is used for P-channel MOS transistor 31 of primary switching circuit 21, resulting in high internal resistance. A transistor with a large area is used for P-channel MOS transistor 32 of secondary switching circuit 22, resulting in low internal resistance. Therefore, when P-channel MOS transistors 31 and 32 of primary and secondary transistors 21 and 22 conduct, the current flows mainly into P-channel MOS transistor 32 of secondary switching circuit 22, and hardly any current flows after said MOS transistor 32 is turned off.

Figure 5:
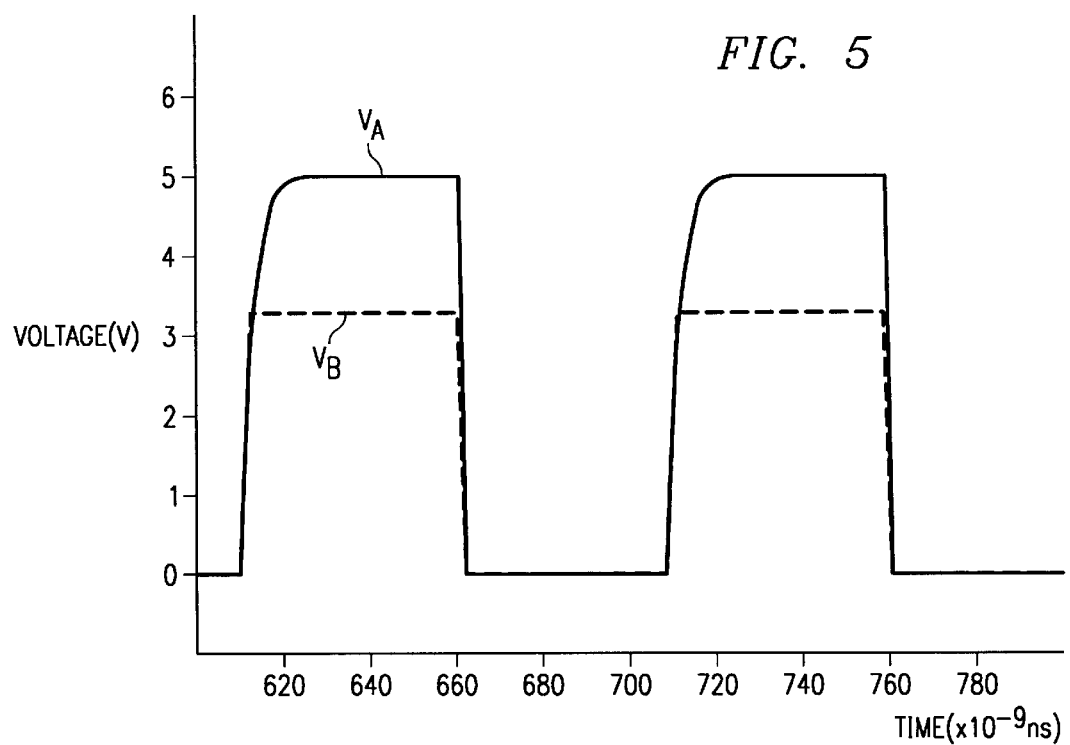
FIG. 5 is a graph (when the high-voltage side port serves as the input side) showing the voltage waveforms of the level conversion circuit of the present invention.

FIG. 5 is a graph showing changes in the waveforms of voltages $V_A$ and $V_B$ when a low-voltage signal is converted into a high-voltage signal when port B of said level conversion circuit 3 serves as the input side, and port A serves as the output side. Voltage $V_A$ at port A serving as the output side follows voltage $V_B$ at port B serving as the input side almost completely.

Figure 6:
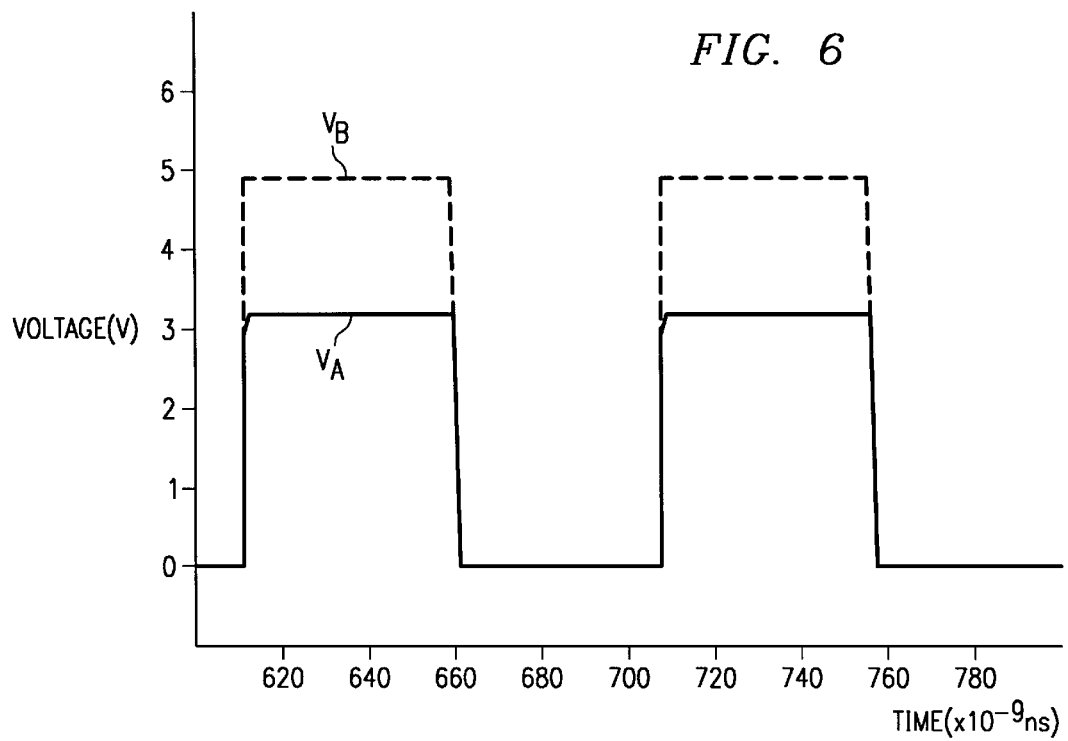
FIG. 6 is a graph (when the low-voltage side port serves as the input side) showing the voltage waveforms of the level conversion circuit of the present invention.

On the other hand, FIG. 6 is a graph showing changes in the waveforms of voltages $V_A$ and $V_B$ when a low-voltage signal is converted into a high-voltage signal when port A serves as the input side, and port B serves as the output side. In this case, the waveforms do not change even when a low-level signal is applied to the EN terminal to turn off primary and secondary switching circuits 21 an 22.

Furthermore, although the case in which the low level was ground level and high levels A and B and power supply voltages $V_{CC}$ and $V_{CCH}$ were positive voltages was used in the explanation above, the present invention can also be applied to the case in which high levels A and B and power supply voltages $V_{CC}$ and $V_{CCH}$ are negative voltages. In such case, (Voltage at high level A)<(Voltage at high level B)< (ground potential).

In addition, although the case in which MOS transistors were used for pass transistor 12 and primary and secondary switching circuits 21 and 22 was explained above, bipolar transistors as well as switching elements of different types can also be used in the present invention.

Bidirectional level conversion can be achieved using a power-saving and space-saving circuit.

What is claimed is:

1. A level conversion circuit comprising:
   a first port to which a first signal is applied, the first signal having a first voltage corresponding to a first logic state;
   a second port to which a second signal having a second voltage below the first voltage and which corresponds to the first logic state is applied,
   a transistor connected between the first and the second ports;
   a first switching circuit connected between a power supply terminal to which a power supply voltage corresponding to the first logic state is applied and the first port, the first switching circuit becoming conductive when the first port is in a first logic state, and
   a second switching circuit which is connected between the power supply terminal to which the power supply voltage corresponding to the first logic state is applied and the first port, the second switching circuit becoming conductive together with the first switching circuit remaining conductive for a predetermined time period when triggered by a change in logic state at the first port whereby a signal having different levels is propagated in one of the direction from the first port to the second port and the direction from the second port to the first port.

2. The level conversion circuit of claim 1, further comprising a resistance coupled between the power supply terminal and the first port and having a value when the first switching circuit conducts that is greater than the resistance value while the second switching circuit conducts.

3. The level conversion circuit of claim 2 further comprising a pulse generator generating a pulse signal applied to the second switching circuit for achieving temporary conduction of the second switching circuit in accordance with changes in the logic level of the first port.

4. The level conversion circuit of claim 3, wherein the transistor and the first and the second switching circuits respectively comprise MOS transistors.

5. The level conversion circuit of claim 4, wherein the transistor is an NMOS transistor, and a voltage higher than a power supply voltage corresponding to the second voltage by an amount equivalent to the threshold voltage of NMOS transistor is applied to a gate terminal of the NMOS transistor.

6. The level conversion circuit of claim 5 further comprising a NAND gate having 2 input terminals respectively connected to the first port and an enable signal application terminal; a voltage supply circuit comprising a diode and a resistor connected in series between the power supply terminal to which the power supply voltage corresponding to the first voltage is supplied and a power supply terminal to which a reference voltage is supplied, and wherein the first and the second switching circuits respectively comprise a first and a second PMOS transistor, the first pulse generator comprises a resistor and a capacitor connected in series between the power supply terminal to which the power supply voltage corresponding to the first voltage is supplied and the output terminal of the NAND gate, and wherein the gate terminal of the first PMOS transistor is connected to the output terminal of the NAND gate, the gate terminal of the second PMOS transistor is connected to a connection node between the resistor and the capacitor of the pulse generator, the gate terminal of the NMOS transistor is connected to a connection node between the diode and the resistor of the voltage supply circuit.

* * * * *